(12) United States Patent
Takai (10) Patent No.: US 10,186,442 B2
(45) Date of Patent: Jan. 22, 2019

(54) CARRIER BUFFERING DEVICE AND STORAGE METHOD

(71) Applicant: Murata Machinery, Ltd., Kyoto-shi, Kyoto (JP)

(72) Inventor: Kaname Takai, Inuyama (JP)

(73) Assignee: Murata Machinery, Ltd (JP)

( * ) Notice: Subject to any disclaimer, the term of this patent is extended or adjusted under 35 U.S.C. 154(b) by 85 days.

(21) Appl. No.: 15/314,911

(22) PCT Filed: Apr. 30, 2015

(86) PCT No.: PCT/JP2015/062940
§ 371 (c)(1),
(2) Date: Nov. 29, 2016

(87) PCT Pub. No.: WO2015/194266
PCT Pub. Date: Dec. 23, 2015

(65) Prior Publication Data
US 2017/0200625 A1    Jul. 13, 2017

(30) Foreign Application Priority Data
Jun. 19, 2014  (JP) .................................. 2014-126016

(51) Int. Cl.
*H01L 21/677*  (2006.01)
*H01L 21/67*   (2006.01)

(52) U.S. Cl.
CPC .. *H01L 21/67733* (2013.01); *H01L 21/67259* (2013.01); *H01L 21/67736* (2013.01); *H01L 21/67769* (2013.01); *B65G 2201/0297* (2013.01)

(58) Field of Classification Search
CPC ...... H01L 21/67733; B65G 2201/0297; B65G 1/0421; B65G 1/0457; Y10S 901/14;
(Continued)

(56) References Cited

U.S. PATENT DOCUMENTS 5,980,183 A  * 11/1999  Fosnight ........... H01L 21/67727
                                                    414/222.01
8,123,456 B2 *  2/2012  Wakabayashi .... H01L 21/67733
                                                    414/281
(Continued)

FOREIGN PATENT DOCUMENTS

JP    2011207621 A  * 10/2011  ....... H01L 21/67733
JP    2012-111635 A    6/2012
(Continued)

OTHER PUBLICATIONS

International Preliminary Report on Patentability and Written Opinion of the International Searching Authority dated Dec. 20, 2016 issued in corresponding PCT application PCT/JP2015/062940.
(Continued)

*Primary Examiner* — James Keenan
(74) *Attorney, Agent, or Firm* — DLA Piper LLP (US)

(57) ABSTRACT

The interference between overhead travelling vehicles and a local vehicle is prevented, in a situation where an overhead travelling vehicle has trouble, and the overhead travelling vehicles and the controller cannot communicate. Carriers are temporarily stored between the overhead travelling vehicles and the load port. The local vehicle travels along a travelling rail for the local vehicle located below a travelling rail for the overhead travelling vehicles and over a load port, and plural buffers are provided. The overhead travelling vehicles and the local vehicle communicate with a controller via a terminal, and a sensor is provided at a height without interference with the local vehicle and detects an element of a hoist of the overhead travelling vehicles or a carrier raised/lowered. The local vehicle is restricted from travelling when the sensor detects an element of hoist or the carrier.

5 Claims, 12 Drawing Sheets (58) Field of Classification Search
CPC .... Y10S 414/14; Y10S 901/08; Y10S 901/46; Y10S 901/47; B66C 13/46
USPC .................................. 212/276; 901/8, 46, 47
See application file for complete search history.

(56) References Cited

U.S. PATENT DOCUMENTS

| | | | |
|---|---|---|---|
| 9,187,260 B2* | 11/2015 | Ota | B65G 37/02 |
| 9,221,604 B2* | 12/2015 | Takagawa | B65G 1/0421 |
| 9,263,311 B2* | 2/2016 | Ota | B65G 1/0457 |
| 9,415,934 B2* | 8/2016 | Ikeda | B66C 19/00 |
| 9,842,756 B2* | 12/2017 | Bonora | H01L 21/67766 |
| 10,083,847 B2* | 9/2018 | Tomida | B66C 15/045 |
| 2010/0003111 A1* | 1/2010 | Yeo | H01L 21/67769 |
| | | | 414/222.07 |
| 2012/0275886 A1 | 11/2012 | Ota | |
| 2013/0142597 A1* | 6/2013 | Kinugawa | H01L 21/67733 |
| | | | 414/222.13 |
| 2015/0170946 A1* | 6/2015 | Ota | H01L 21/67733 |
| | | | 212/276 |

FOREIGN PATENT DOCUMENTS

| | | | |
|---|---|---|---|
| WO | 2013-183384 A1 | 12/2013 | |
| WO | WO-2014017221 A1 * | 1/2014 | ....... H01L 21/67733 |

OTHER PUBLICATIONS

English language translation of International Search Report dated Jul. 21, 2015 issued in corresponding PCT application PCT/JP2015/062940.

* cited by examiner

CARRIER BUFFERING DEVICE AND STORAGE METHOD

CROSS REFERENCE TO RELATED APPLICATIONS

This application is a national stage of international application no. PCT/JP2015/062940, filed on Apr. 30, 2015, and claims the benefit of priority under 35 USC 119 of Japanese application no. 2014-126016, filed on Jun. 19, 2014, both of which are incorporated herein by reference in their entirety.

BACKGROUND OF THE INVENTION

Field of the Invention

The present invention relates to temporarily storing a carrier in which semiconductor wafers or the like are housed.

Description of the Related Art

In order to improve the utilisation rate of semiconductor fabrication equipment, temporal storage apparatuses (buffers) are provided in the vicinity of load ports of semiconductor fabrication equipment. In this regard, Patent Literature 1 (JP 2012-111635) by the applicant has proposed to provide a travelling rail for a local vehicle in parallel with and below a travelling rail for overhead travelling vehicles (overhead hoist transports (OHT)). If buffers suitable for transfer between the local vehicle and between the overhead travelling vehicles are provided at positions under the travelling rail for the local vehicle and not over the load ports, for example, four buffers may be provided. If the buffers are not sufficient in its their number, then, providing the overhead travelling vehicles and the local vehicle with a lateral transfer mechanism for carriers and providing additional buffers at downward and sideway positions from the travelling rail for the local vehicle are a possible design for increasing the number of buffers.

Patent Literature 2 (WO 2013/183384) also by the applicant has proposed to remove interference between overhead travelling vehicles and a local vehicle by a mutual exclusion control through communication terminals. Namely, communication terminals are provided along a travelling rail for overhead travelling vehicles and a travelling rail for a local vehicle, and if an overhead travelling vehicle starts communication first, then, the local vehicle is prohibited from entering. If the local vehicle starts communication first, then, the overhead travelling vehicle is prohibited from performing transfer. Thus, a mutual exclusion control is performed such that the local vehicle does not enter into a position where an overhead travelling vehicle is transferring a carrier.

CITATION LIST

Patent Literatures

Patent Literature 1: JP2012-111635
Patent Literature 2: WO2013/183384

SUMMARY OF THE INVENTION

Problem to be Solved by the Invention

The inventor has found the system in Patent Literature 2 may not completely remove the interference between of the overhead travelling vehicle and the local vehicle interfering. Namely, suppose a case where an error occurs in the overhead travelling vehicle for some reason after the start of transfer with the necessary priority. If the overhead travelling vehicle causes an error, the controller cooperating with the overhead travelling vehicle is also deemed as being in an erroneous state. Since it needs time to manually check and reset (restore) the overhead travelling vehicle located in a high space, only the controller may be reset in some cases. At this time, since the overhead travelling vehicle has an error and may not be outputting a transfer signal to the communication terminal. Then, the controller may not detect the obstruction for the local vehicle to travel and make the local vehicle travel to the position where the overhead travelling vehicle is transferring a carrier.

The problem to be solved by the present invention is to reliably prevent the local vehicle and the overhead travelling vehicle from interfering, even if the overhead travelling vehicle has an error. In particular, this invention aims to allow the local vehicle to travel before the recovery (reset) of an overhead travelling vehicle.

Means for Solving Problem

A temporary storage apparatus according to the invention temporarily stores carriers between overhead travelling vehicles travelling along a travelling rail and provided with a hoist for raising and lowering a carrier and a load port of equipment and comprises:

a local vehicle provided with a hoist for raising and lowering a carrier and configured to travel;

a travelling rail for the local vehicle provided below the travelling rail for the overhead travelling vehicles and over the load port;

a plurality of buffers provided along the travelling rail for the local vehicle, wherein carriers may be placed on the buffers by both the overhead travelling vehicles and the local vehicle;

a controller configured and programmed to control the local vehicle; and a sensor provided at a height without interference with the local vehicle and configured to detect an element of the hoist of the overhead travelling vehicles or a carrier being raised or lowered by the hoist;

wherein the controller is configured and programmed to prevent interference between the overhead travelling vehicles and the local vehicle by communication with the overhead travelling vehicles, and wherein the controller is configured and programmed to restrict the local vehicle from travelling when the sensor detects an element of the hoist or a carrier.

A temporary storage method according to the invention for temporarily stores carriers between overhead travelling vehicles travelling along a travelling rail and provided with a hoist for raising and lowering a carrier and a load port of equipment, with usage of a temporary storage apparatus. The apparatus comprises:

a local vehicle provided with a hoist for raising and lowering the carrier and configured to travel;

a travelling rail for the local vehicle, provided at a position below the travelling rail for the overhead travelling vehicles and over the load port;

a plurality of buffers provided along the travelling rail for the local vehicle, wherein carriers can be placed on the buffers by both the overhead travelling vehicles and the local vehicle;

a controller configured and programmed to control the local vehicle; and a sensor provided at a height without interference with the local vehicle and configured to detect an element of the hoist of the overhead travelling vehicles or a carrier being raised or lowered by the hoist.

The temporary storage method comprises:

a step by the controller to communicate with the overhead travelling vehicles and to prevent interference between the overhead travelling vehicles and the local vehicle; and a step by the controller to restrict the local vehicle from travelling upon detection by the sensor of an element of the hoist or a carrier.

According to the present invention, an element of a hoist suspended from an overhead travelling vehicle or a carrier is detected by the sensor. Therefore, it is detected, independently of communication between the overhead travelling vehicle and the controller, that the overhead travelling vehicle is performing transfer. Therefore, when an error caused in the overhead travelling vehicle, the local vehicle may resume travelling without waiting for the recovery of the overhead travelling vehicle.

Preferably, the hoist of the overhead travelling vehicles is configured to raise and lower an elevation platform that holds a carrier by suspenders, and wherein the sensor is located at a position suitable for detecting the suspenders. At the position where the suspender is suitably detected, both the elevation platform and the carrier supported by the elevation platform may be detected, and therefore, it is reliably detected that the overhead travelling vehicle is transferring.

The travelling rail for the local vehicle is divided into a plurality of areas arranged along a travelling direction of the local vehicle, the sensor is provided in each area of the travelling rail for the local vehicle, and the controller is configured and programmed to prohibit the local vehicle from entering into an area where the sensor detects an element of the hoist or a carrier. Since detection is performed in each area, the local vehicle is prohibited from travelling only within the area where the overhead travelling vehicle is transferring, and it is not prohibited from travelling in other areas.

Preferably, the plurality of buffers include a slidable buffer slidable between a position under the travelling rail for the local vehicle and a position laterally separated from the travelling rail, and may include a fixed buffer fixed under the rail for the local vehicle. The slidable buffer may be provided over the load port and the number of buffers that can be provided is increased. Also, an overhead travelling vehicle provided with a lateral transfer mechanism for a hoist may transfer between the slidable buffer at a position not under the travelling rail for the local vehicle and thus, the possibility of the interference between the overhead travelling vehicles and the local vehicle is reduced.

DETAILED DESCRIPTION OF THE PREFERRED EMBODIMENTS

The best embodiment for carrying out the present invention is described in the following. The scope of the present invention is based on the claims and is to be construed with reference to the description and well-known techniques in the field in accordance with understanding of a person skilled in the art.

Embodiment

Figure 1:
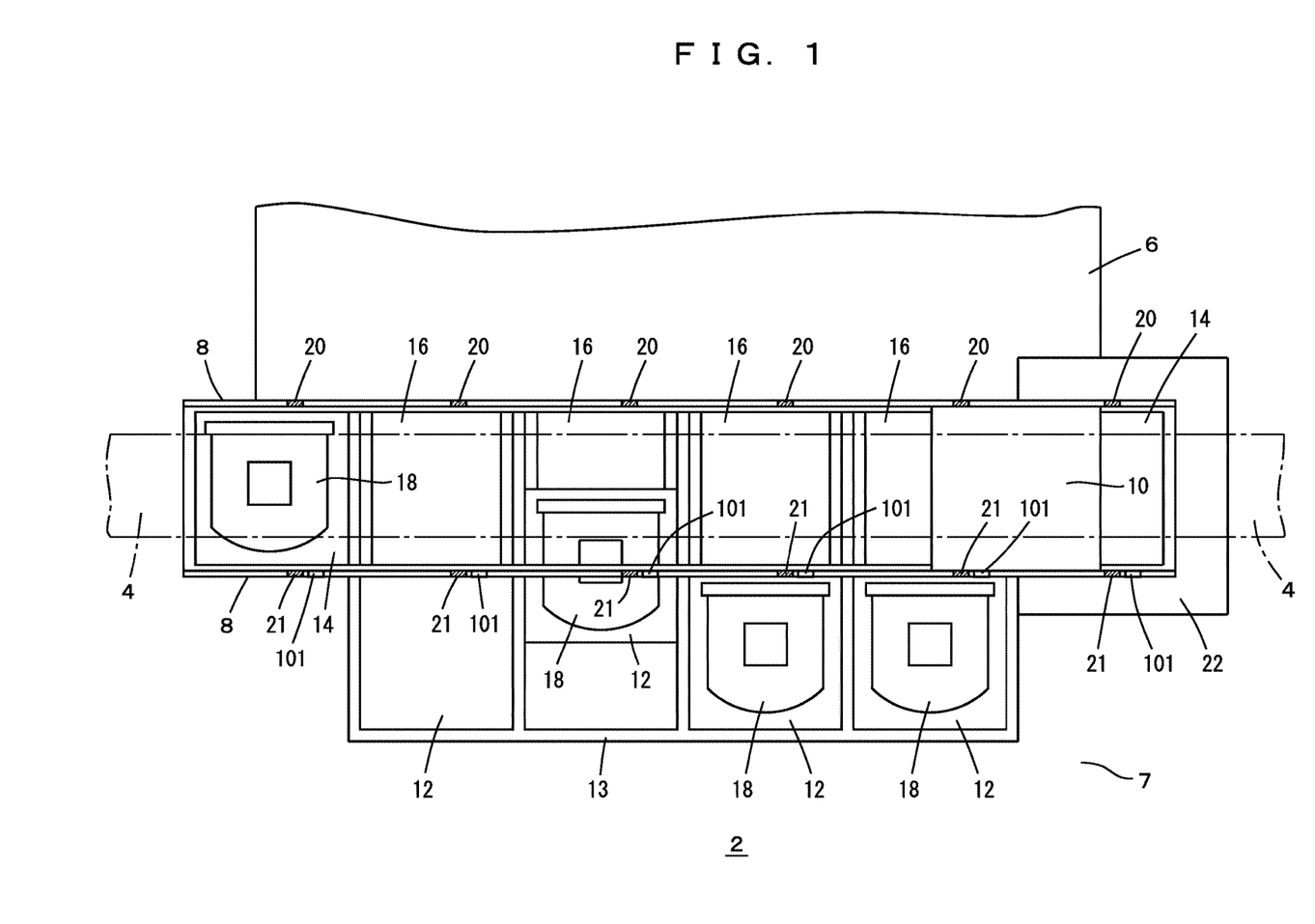
FIG. 1 is a plan view of a temporary storage apparatus for carriers according to an embodiment.
Figure 2:
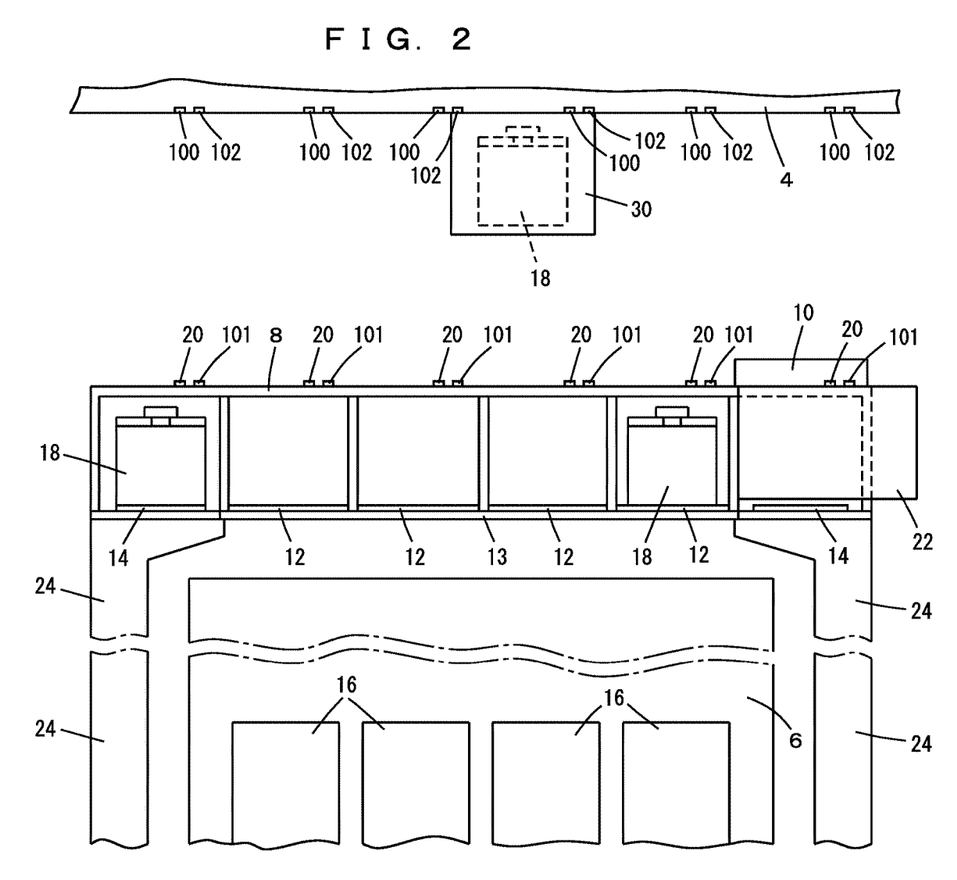
FIG. 2 is a fragmentary side view of the temporary storage apparatus for carriers according to the embodiment.
Figure 3:
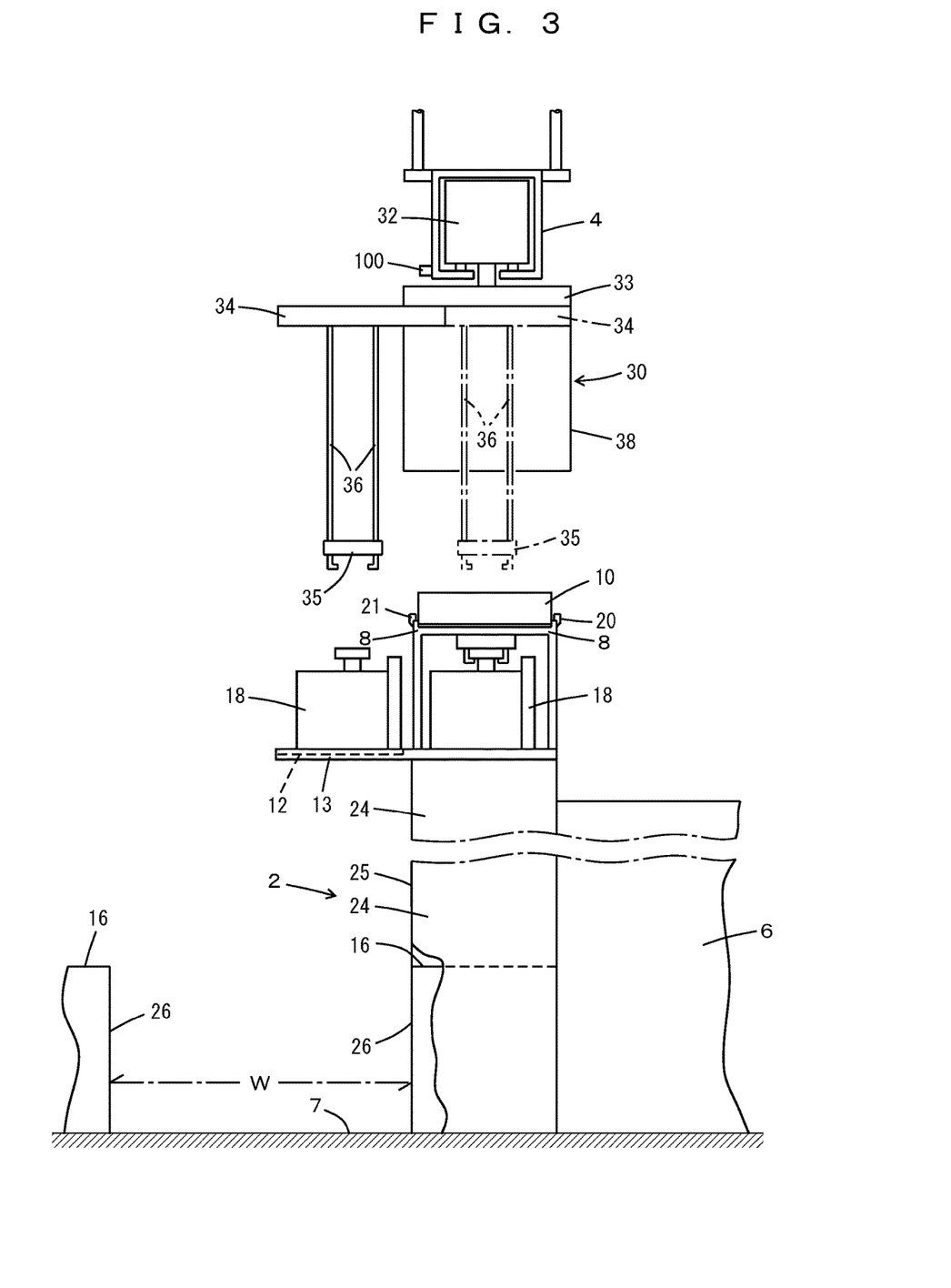
FIG. 3 is a fragmentary front view of the temporary storage apparatus for carriers according to the embodiment.

FIG. 1 to FIG. 12 show a temporary storage apparatus 2 for carriers (a temporary storage apparatus) according to an embodiment of the invention and modifications thereof. The temporary storage apparatus 2 is provided in a cleanroom or the like, and travelling rail 4 for overhead travelling vehicles (OHT) 30, as is shown in FIG. 3, is supported from the ceiling of the cleanroom. Reference numeral 6 indicates fabrication equipment for semiconductors or the like. The equipment includes an inspection apparatus and is provided with one or more load ports 16. Articles such as semiconductor wafers and reticles are housed in a carrier 18 such as a front-opening unified pod (FOUP), the carrier is temporarily stored on slidable buffers 12 and fixed buffers 14 and is transported by the overhead travelling vehicle (OHT) 30 and a local vehicle 10.

The temporary storage apparatus 2 is provided over a passage 7 in the cleanroom at a height without interference with people. Along a pair of travelling rails 8,8 over the row of load ports 16 in parallel with the equipment 6, the local vehicle 10 travels on the uppermost part of the temporary storage apparatus 2. There is a gap between the travelling rails 8,8 for passing the carrier 18, and the overhead travelling vehicles 30 and the local vehicle 10 transfer the carrier 18 through the gap between the travelling rails 8,8.

At positions corresponding to the load ports 16 and so on, the slidable buffers 12 are supported by a frame 13 of the temporary storage apparatus 2. The slidable buffers 12 are configured to move back and forth between a forward position under the travelling rails 8,8 and a rearward position laterally separated from the position under the travelling rails 8,8. Preferably, in addition to the slidable buffers 12, at least a fixed buffer 14 is provided at one end or both ends of the travelling rails 8,8. Positions over the load ports 16 and positions over the fixed buffers 14 are stop positions for the local vehicle 10 and the overhead travelling vehicles 30, and the positions over the fixed buffers 14 also serve as waiting positions for the local vehicle 10. Note that slidable buffers 12 may be provided in place of the fixed buffers 14 to omit the fixed buffers 14. Positions not over the load ports 16 are allocated as waiting positions for the local vehicle 10. Therefore, a trouble in the local vehicle 10 does not prevent the transfer between the load ports 16 and the overhead travelling vehicles 30.

The stop positions (area) for the local vehicle 10 and the overhead travelling vehicles 30 correspond one-to-one to the load ports 16 or the fixed buffers 14, and, at each stop position, terminals 100 to 102 shown in FIGS. 1 to 3 and FIG. 10 are provided and establish interlock between the transfer by the overhead travelling vehicles 30 and the entrance (running) of the local vehicle 10. Reference numeral 20 indicates an optical sensor and 21 a reflection plate. Reference numerals 101 indicate terminals for the local vehicle 10 to communicate with a buffer controller 22, and 100 and 102 indicate terminals for the overhead travelling vehicles to communicate with the buffer controller 22; the sensor 20, the reflection plate 21, terminals 100 to 102 are provided at each stop position (area). When the light path between the optical sensor 20 and the reflection plate 21 is blocked, the optical sensor 20 detects an elevation platform from the overhead travelling vehicle 30, a belt suspending the elevation platform, or a carrier held by the elevation platform.

The optical sensors 20 and the reflection plates 21 are provided at positions where the belt extending from the overhead travelling vehicle 30 can be detected, and therefore, the belt, the elevation platform, and a carrier supported by the elevation platform are all detectable. The buffer controller 22 controls the local vehicle 10 and the slidable buffers 12, establishes interlock between the overhead travelling vehicle 30 and the local vehicle 10, and communicates with the equipment 6. In place of the optical sensor 20 which projects and receives light, a light-emitting unit and a light-receiving unit may be provided at both sides of the belt passing position. Also, instead of detecting the light being blocked by the belt or the like, an ultrasonic reflection by the belt, or the like may be detected.

As shown in FIGS. 2 and 3, the temporary storage apparatus 2 is supported by a pair of trestles 24 that have a gate-like shape, and front faces 25 of the trestles 24 toward the passage 7 are located, relative to the passage 7, at approximately the same position as front faces 26 of the load ports 16 or closer to the equipment 6 than the front faces 26. Therefore, the width W of the passage 7 is dependent on the positions of the load ports 16, and temporary storage apparatus 2 does not make the width W of the passage 7 narrower. "Approximately the same" means that the difference between the front faces is up to ±100 mm, particularly up to ±50 mm, and preferably the front faces 25 and 26 are located at substantially the same position. The temporary storage apparatus 2 may be suspended from the ceiling of the cleanroom or from the travelling rail 4 for the overhead travelling vehicles 30. However, it is easy to transport, install, and position the temporary storage apparatus 2 supported by the trestles 24 into the cleanroom. The trestles 24 having the front faces 25 not protruding toward the passage 7 over the load ports 16 do not make the passage narrower.

The structure of the overhead travelling vehicles 30 is shown in FIG. 3. A travelling unit 32 travels in the travelling rail 4 and also supports a lateral transfer mechanism 33 which laterally moves a raising and lowering drive 34 in a horizontal direction orthogonal to the travelling rail 4. The raising and lowering drive 34 feeds and winds up suspenders such as belts 36 to raise and lower an elevation platform 35 that holds and releases a carrier 18. A hoist comprises the raising and lowering drive 34, the elevation platform 35, and the belts 36. The optical sensor 20 already described detects the hoist and the carrier supported by the hoist. Reference numeral 38 indicates an anti-fall hood that prevents the carrier 18 from falling. In addition, a mechanism for rotating the raising and lowering drive 34 about a vertical axis may also be provided. For an overhead travelling vehicle without the lateral transfer mechanism 33, the slidable buffers 12 move forward to positions under the travelling rails 8,8.

Figure 4:
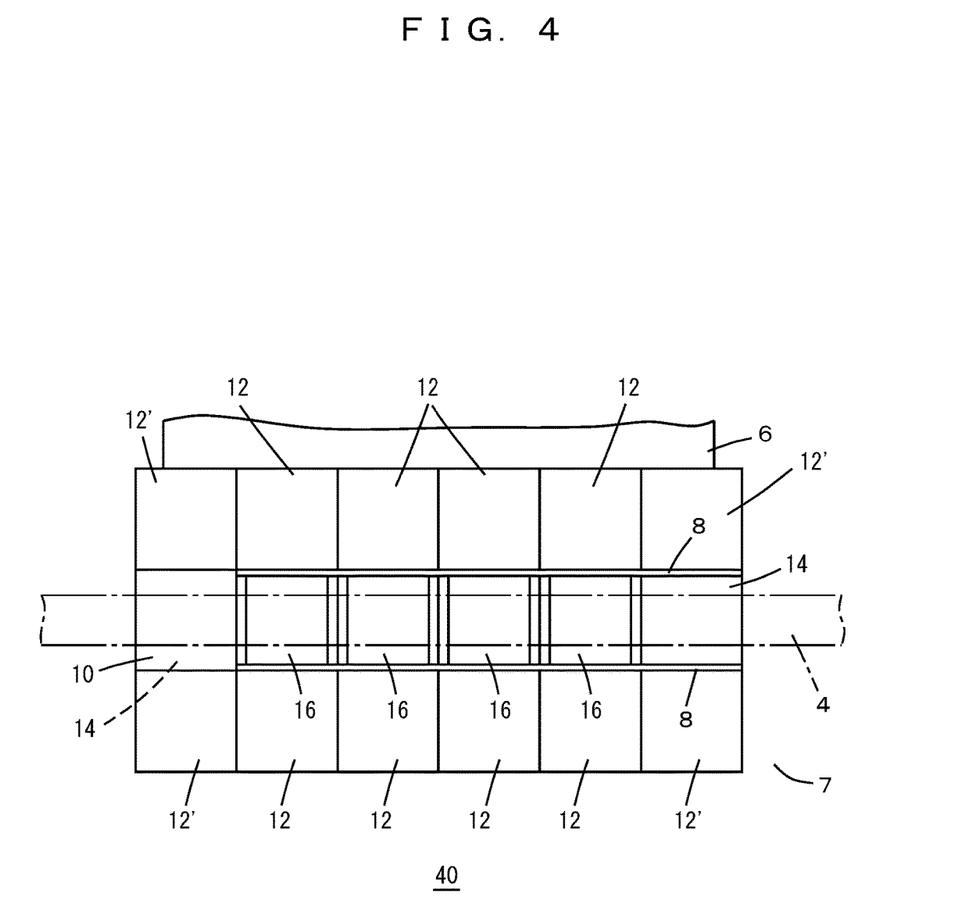
FIG. 4 is a plan view schematically showing a modification with an increased storage capacity.
Figure 5:
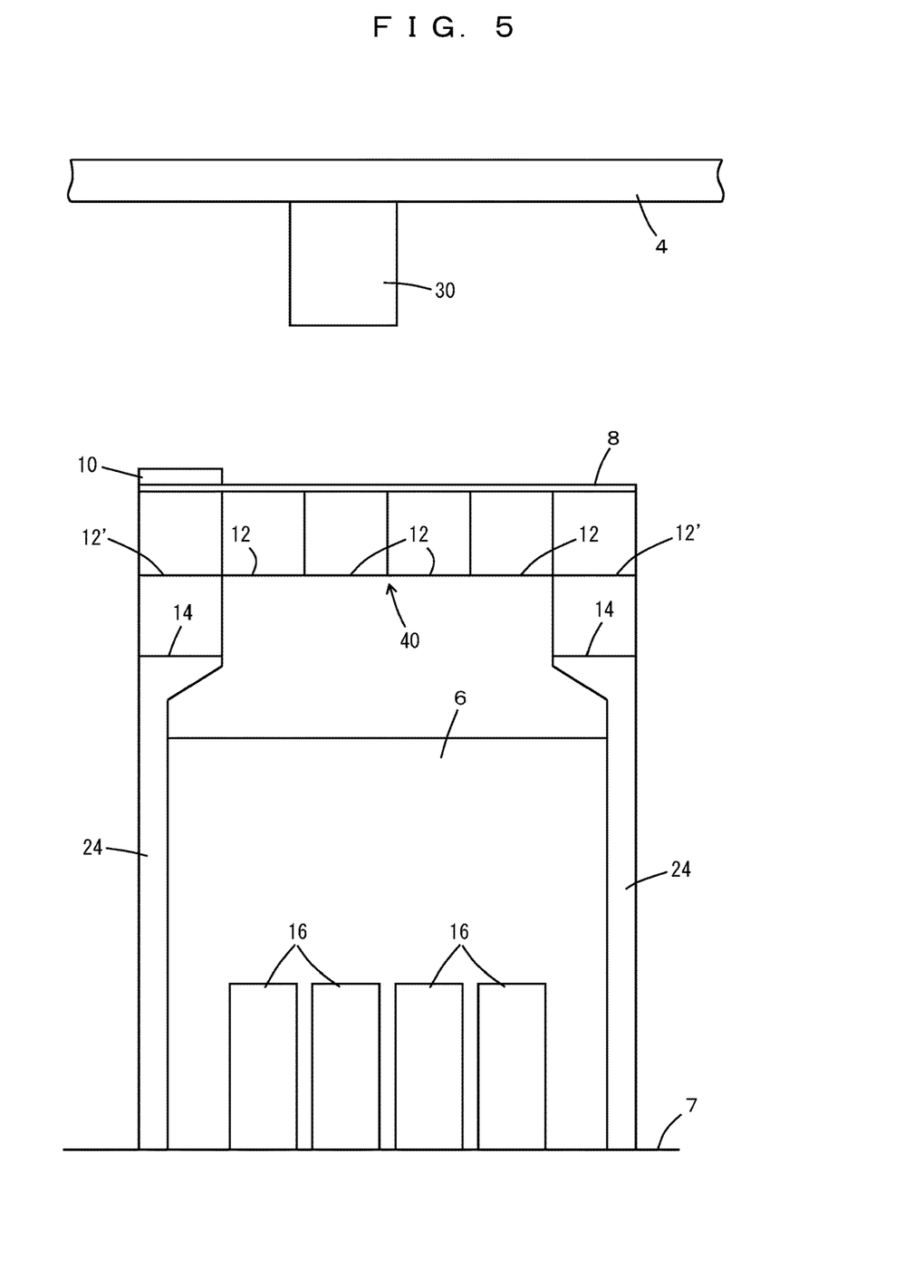
FIG. 5 is a side view schematically showing the modification with an increased storage capacity.

The temporary storage apparatus 2 shown in FIGS. 1 to 3 is provided with four slidable buffers 12 and two fixed buffers 14, and the equipment 6 is provided with four load ports 16, for example. A temporary storage apparatus 40 with maximum capacity for storing carriers 18 and serving the four load ports 16 is shown in FIGS. 4 and 5. In the temporary storage apparatus 40, the fixed buffers 14 are located at positions lower than the slidable buffers 12 by a height corresponding to one carrier (FIG. 5), and consequently the occupation height of the temporary storage apparatus 40 is made larger. The slidable buffers 12 are provided on both sides of the travelling rails 8,8, and further slidable buffers 12' are provided at positions above the fixed buffers 14 and shifted from the load ports 16 so that they move forward over the fixed buffer. As a result, eight slidable buffers 12, four slidable buffers 12' separated from the load ports 16, and two fixed buffers 14 are provided, and positions over the fixed buffers 14 are the waiting positions for the local vehicle 10.

Figure 6:
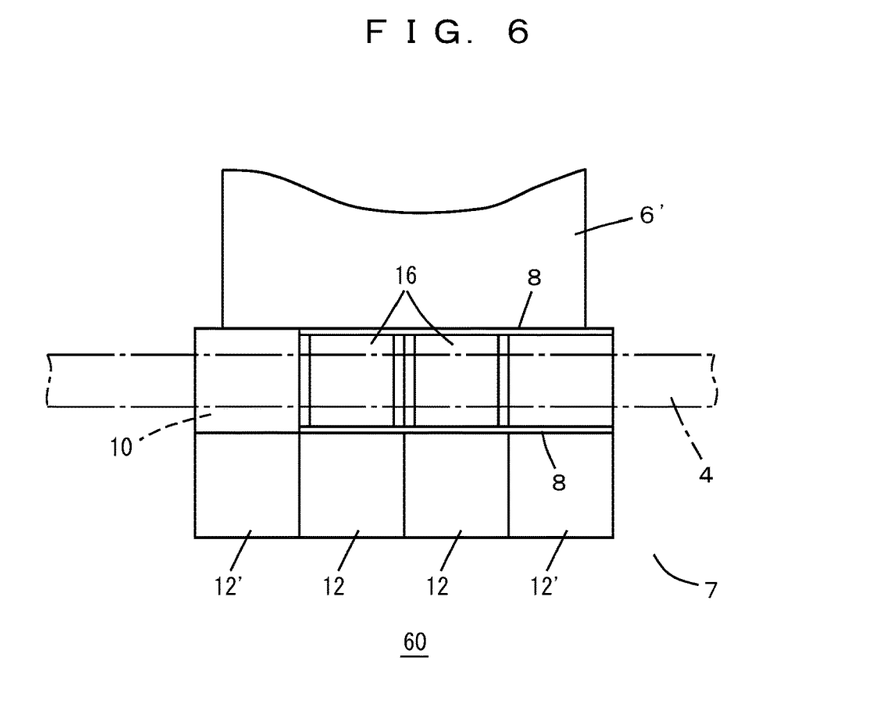
FIG. 6 is a plan view schematically showing another modification for small equipment.

FIG. 6 shows a temporary storage apparatus 60 for small equipment 6' and with a smaller storage capacity. The equipment 6' is provided with two load ports 16, and the temporary storage apparatus 60 is provided with four slidable buffers. Positions over the slidable buffers 12' separated from the load ports 16 are the waiting positions for the local vehicle 10. While a structure similar to that shown in FIG. 5 allows two additional fixed buffers 14, it increases the height of the temporary storage apparatus 60.

Figure 7:
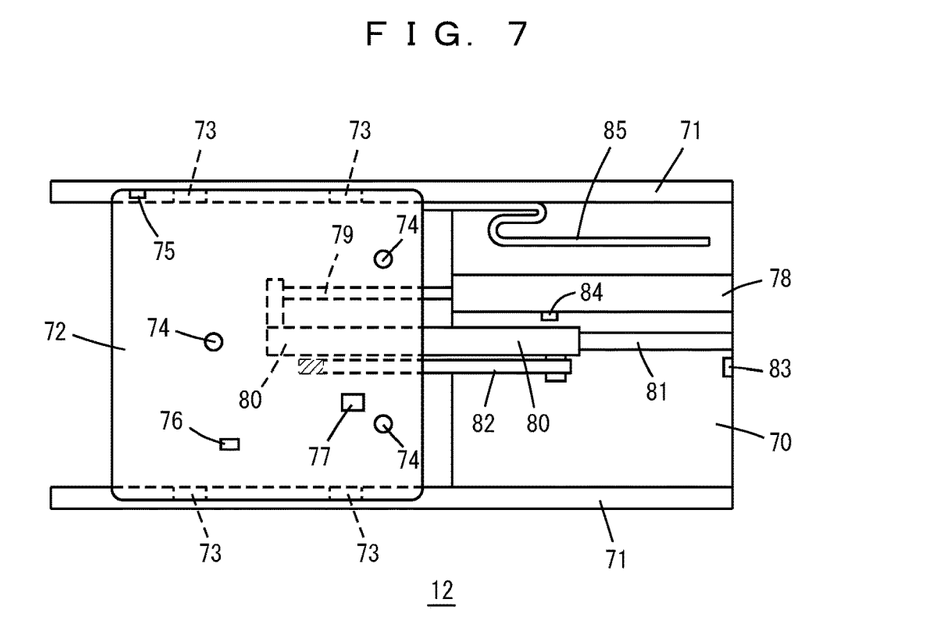
FIG. 7 is a plan view of a slidable buffer.

FIG. 7 shows the structure of the slidable buffer 12. Reference numeral 70 indicates a base fixed to the frame of the temporary storage apparatus, and a pedestal 72 moves back and forth between a forward position and a rearward position along rails 71,71 by wheels 73. The forward position is a position under the travelling rails for the local vehicle and, and the rearward position is laterally separated from the forward position. For example, three positioning pins 74 provided on the pedestal 72 position the bottom portion of the carrier 18. A carrier sensor 75 detects whether the carrier 18 is present, a seating sensor 76 detects whether the carrier 18 is seated at a correct position over the positioning pins 74, and an ID reader 77 reads the ID of the carrier. The ID reader 77 may be omitted, and both the sensors 75, 76 and the ID reader 77 are provided for the fixed buffers in the same manner.

A linear guide 80 is moved back and forth along a rail 81 by a cylinder 78 such as a pneumatic cylinder or a hydraulic cylinder and a piston 79 or by a motor and a toothed belt or the like (not shown). The pedestal 72 is moved back and forth by a double speed mechanism comprising a toothed belt 82 and so on, at twice the stroke of the linear guide 80. The double speed mechanism has been widely used in slide forks, and another mechanism may be adopted to move the pedestal 72 back and forth. A sensor 83 detects that the linear guide 80 is at a rearward position, and a sensor 84 detects that the linear guide 80 is at a forward position. A cable guide 85 guides a power supply line and a signal line bendably and connects the sensors 75, 76 and the ID reader 77 to the base 70. The sensors 83 and 84 act to detect the positions of the pedestal 72, and the rails 71 may be provided with, for example, an optical sensor for detecting the front end position of the pedestal and an optical sensor for detecting the rear end position of the pedestal.

Figure 8:
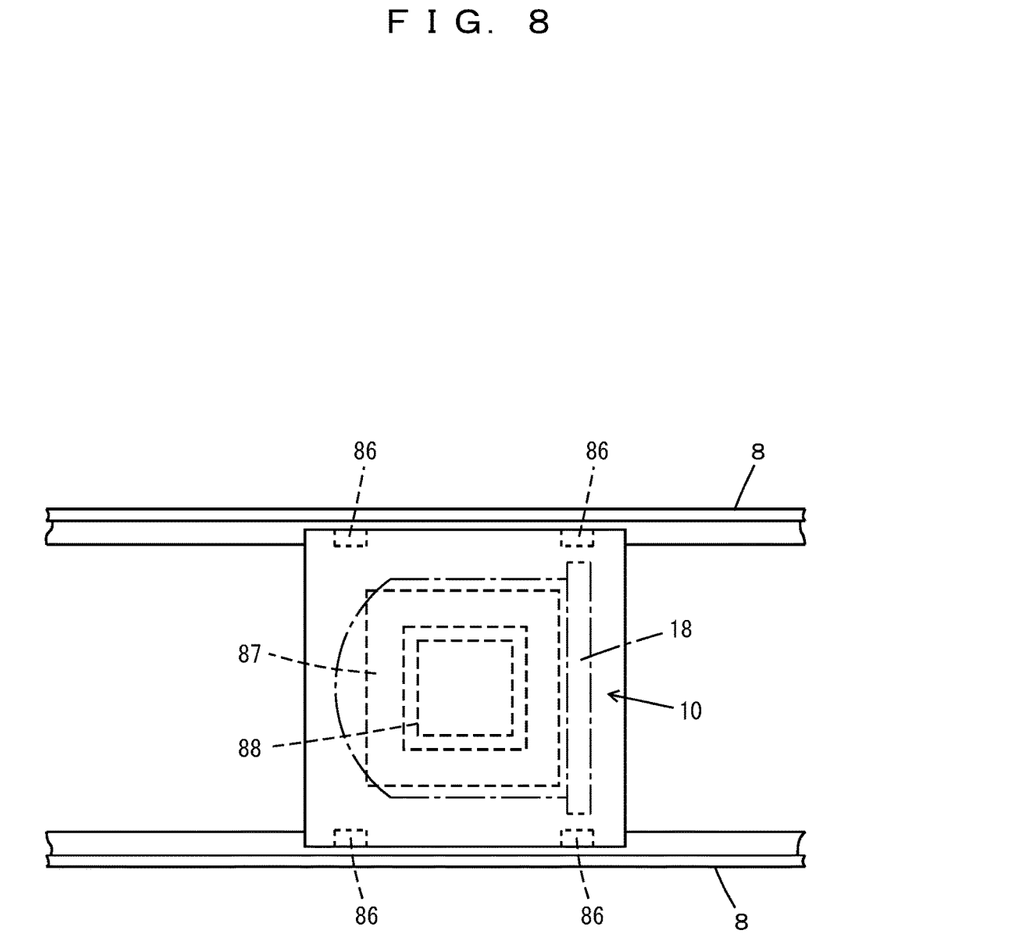
FIG. 8 is a plan view of a local vehicle.

FIG. 8 shows the structure of the local vehicle 10. The local vehicle 10 travels along the pair of travelling rails 8,8 by wheels 86 and a motor (not shown) and raises and lowers an elevation platform 88 that holds and releases the carrier 18 by a raising and lowering drive 87, belts (not shown), and so on. In addition to them, the local vehicle 10 is further provided with a communication device to communicate with the buffer controller 22, another communication device to communicate with a terminal for interlock between the overhead travelling vehicle 30, a power supply such as a battery, and an on-board controller.

Figure 9:
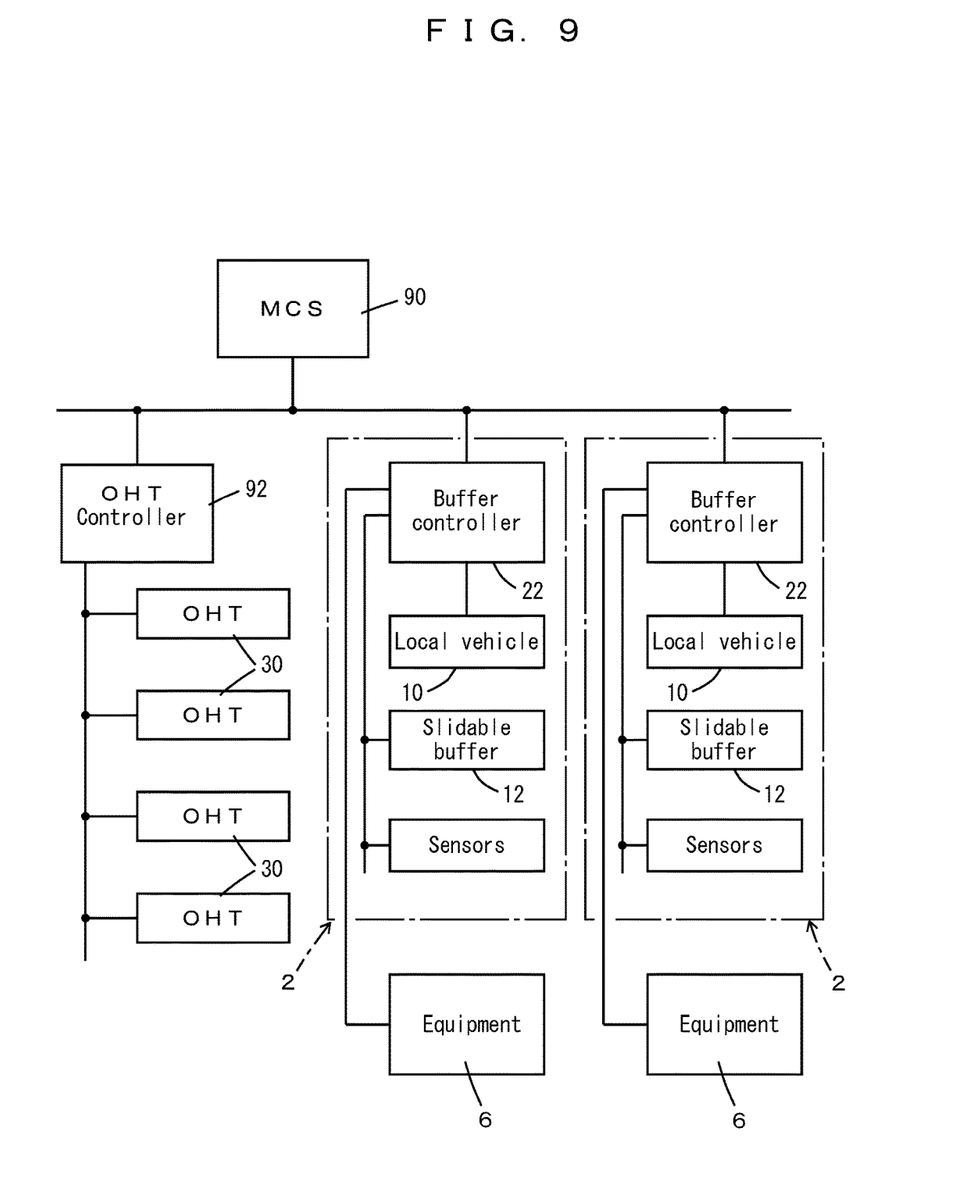
FIG. 9 is a block diagram showing a control system for local vehicles and overhead travelling vehicles according to the embodiment.

FIG. 9 shows the temporary storage apparatuses 2 and control systems in the environment. A material control system (MCS) 90 communicates with a host controller (not shown) or the like, receives requests regarding the transport of carriers, and instructs an OHT controller 92 and the buffer controllers 22 to transport the carriers.

The OHT controller 92 instructs a plurality of overhead travelling vehicles 30 to transport the carriers. The buffer controllers 22 instruct the local vehicles 10 to transport the carriers and control the back and forth movement of the slidable buffers 12.

The buffer controllers 22:
detect the states of the temporary storage apparatuses 2 (the presence or absence of a carrier in each buffer and the position of each slidable buffer 12) by the optical sensor 20, the sensors 75 and 76, the ID reader 77, the sensors 83 and 84, terminals described later, and so on; and
establish the interlock between the overhead travelling vehicles 30 and the local vehicles 10.

Figure 10:
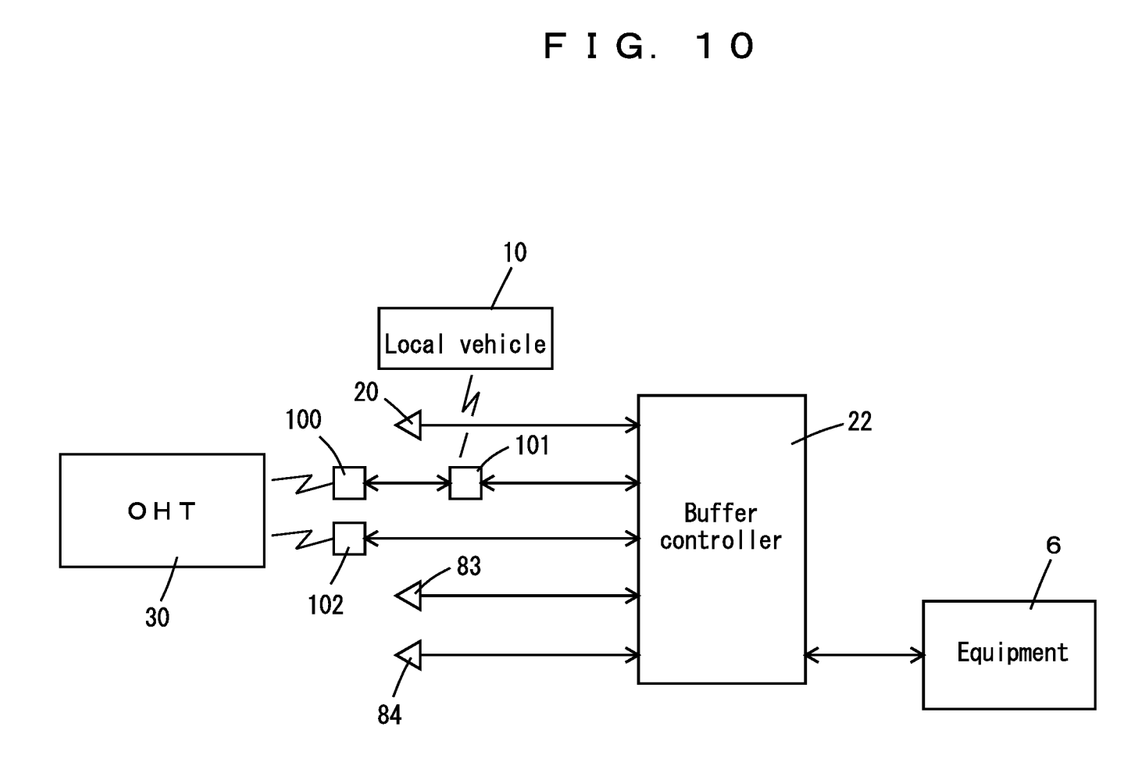
FIG. 10 is a block diagram showing an interlock mechanism according to the embodiment.

FIG. 10 shows an interlock mechanism between an overhead travelling vehicle 30 and a local vehicle 10. The optical sensor 20 detects the hoist of the overhead travelling vehicle 30, such as the belt and the elevation platform, or detects a carrier raised or lowered by the overhead travelling vehicle 30. Thus, the optical sensor 20 can detect that the overhead travelling vehicle 30 is transferring a carrier, as well as the stop position of the overhead travelling vehicle 30.

When the overhead travelling vehicle 30 transfers a carrier between a load port under the travelling rail, a fixed buffer, or a slidable buffer at a forward position under the travelling rails, the overhead travelling vehicle 30 requests the buffer controller 22 for transfer permission via the terminal 100. When the local vehicle 10 transfers a carrier between these positions, the local vehicle 10 requests the buffer controller 22 for transfer permission via the terminal 101.

The buffer controller 22 detects the position of the slidable buffer according to signals from the sensors 83 and 84 and checks whether a carrier is present in the slidable buffer or the fixed buffer. And, if the transfer is possible, the buffer controller 22 permits the request. The buffer controller 22 also communicates with the equipment 6, forwards a request for the transfer of a carrier between a load port and the overhead travelling vehicle 30 or the local vehicle 10, and receives a permission signal from the equipment 6. Based on the above process, the buffer controller 22 transmits transfer permission to the overhead travelling vehicle 30 and the local vehicle 10 via the terminals 100 and 101. The transfer permission signals of the buffer controller 22 are set in the terminals 100 and 101, and the overhead travelling vehicle 30 and the local vehicle 10 perform transfer after checking the transfer permission.

The transfer processes by the local vehicle 10 and the overhead travelling vehicle 30 have been described, and transfer by the overhead travelling vehicle 30 may conflict with the entrance of the local vehicle 10. Therefore, the local vehicle 10 requests the buffer controller 22 in advance via the terminal 101 for permission for each of the stop positions that the local vehicle 10 enters. If there is no interference with transfer by the overhead travelling vehicle 30, the buffer controller 22 permits the request for entrance of the local vehicle 10 for each stop position. After checking the entrance permission signal via the terminal 101, the local vehicle 10 enters the permitted stop position.

The overhead travelling vehicle 30 can transfer a carrier between a slidable buffer located at the rearward position (a position not under the travelling rails for the local vehicle 10) by the lateral transfer device. This transfer does not interfere with the travelling of the local vehicle 10 nor the transfer by the local vehicle 10. In this case, the overhead travelling vehicle 30 requests the buffer controller 22 via the terminal 102 for transfer permission, and the buffer controller 22 permits the request if the required slidable buffer is ready to be transferred. The terminals 102 and 100 may be integrated into one terminal.

There may be interference between transfer between the load port and the fixed buffer by the overhead travelling vehicle 30 and the entrance (travelling) of the local vehicle 10, and this is avoidable by establishing the interlock via the terminals 100 and 101. Even if interlock established via the terminal 100 might not suffice, interference between the local vehicle 10 and the overhead travelling vehicle 30 is avoidable by detecting the belt, the elevation platform of the overhead travelling vehicle 30, carriers, and so on. Regarding transfer between the slidable buffer at the rearward position and the overhead travelling vehicle 30, the interlock may be established via the terminal 102. Furthermore, the buffer controller 22 may detect the position of the slidable buffer by the sensors 83 and 84.

These interlock may be dealt with by a controller other than the buffer controller 22. If the buffer controller 22 has been notified by the local vehicle 10 of its position, the buffer controller 22 may request a built in interlock processing unit for entrance permission for the local vehicle 10 and may permit by itself to enter, without the communication between the terminal 101 and the local vehicle 10.

Figure 11:
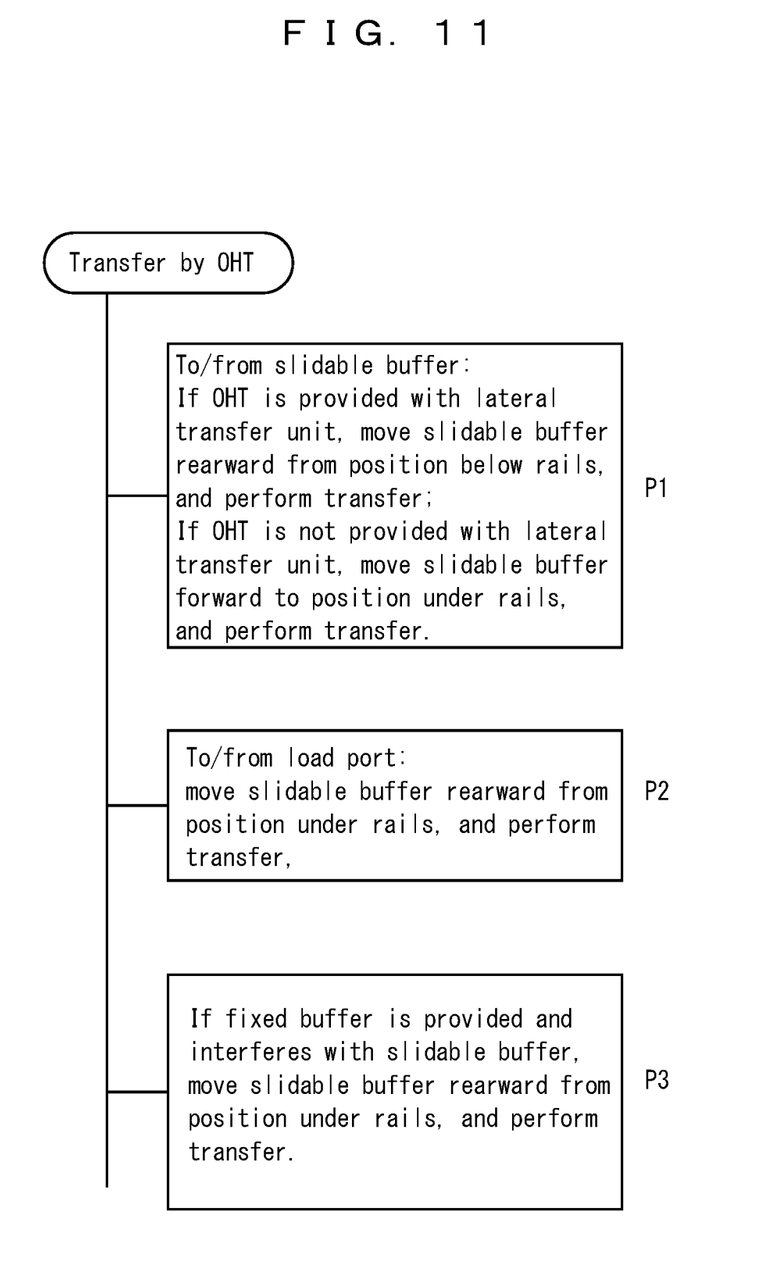
FIG. 11 is a diagram showing a transfer algorithm of overhead travelling vehicles according to the embodiment.

FIG. 11 shows a transfer algorithm of an overhead travelling vehicle to transfer between the temporary storage apparatus. Regarding transfer between a slidable buffer (process P1) and the overhead travelling vehicle provided with the lateral transfer device, the slidable buffer moves rearward from a position under the travelling rails, and the transfer is performed at a rearward position without interference with the local vehicle. For the overhead travelling vehicle not provided with the lateral transfer device, the slidable buffer moves forward to a position under the travelling rails, and the transfer is performed at this position. Interlock in this case is the same as that for transfer between a load port.

Regarding transfer between a load port (process P2), the slidable buffer moves rearward from the position under the travelling rails 8,8 shown in FIG. 1, and the transfer is performed. Regarding transfer between a fixed buffer (process P3), if a slidable buffer is present over the fixed buffer as shown in FIG. 5, the slidable buffer moves rearward from the position over the fixed buffer, and the transfer is performed.

Figure 12:
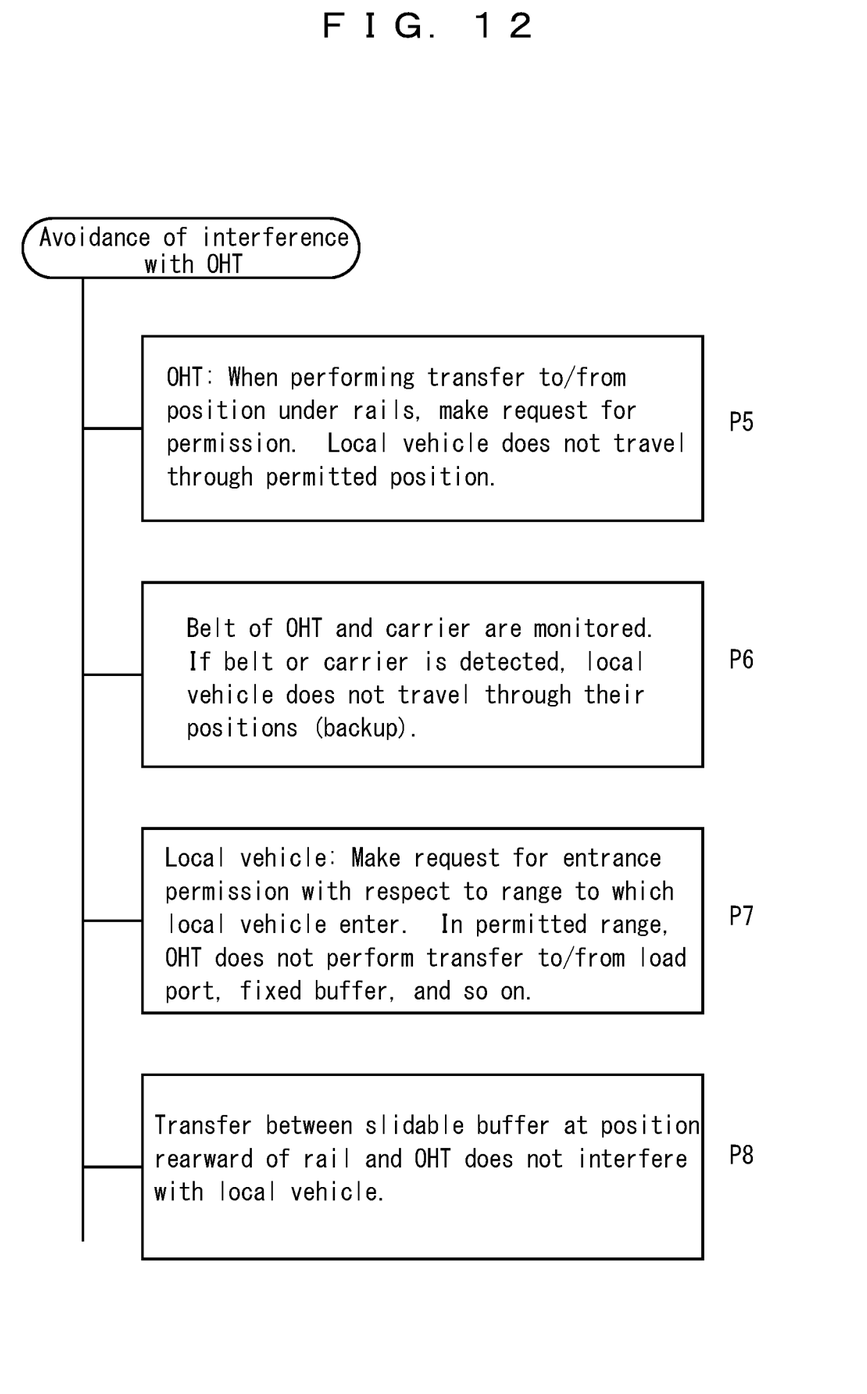
FIG. 12 is a diagram showing an algorithm for avoiding interference between an overhead travelling vehicle and a local vehicle according to the embodiment.

FIG. 12 shows an algorithm for avoiding interference between an overhead travelling vehicle and a local vehicle.

When transferring a carrier between a slidable buffer located under the travelling rails for the local vehicle, a load port, or a fixed buffer, the overhead travelling vehicle (OHT) requests for transfer permission via a terminal in advance. The local vehicle requests for entrance permission for each of the stop positions to enter and makes a further request for transfer permission for transfer in addition to the entrance permission. For the same stop position, only one request out of the transfer request from the overhead travelling vehicle and the entrance request from the local vehicle may be permitted, and the interference between the overhead travelling vehicle and the local vehicle is avoided (process P5).

If an error within an overhead travelling vehicle occurs after the start of transfer between a load port and so on, the buffer controller is also stopped as having an error, and the buffer controller is recovered by a reset operation. At this moment, the overhead travelling vehicle can be not sending the signal indicating being transferring to the terminal, and the buffer controller might be unable to recognize that the overhead travelling vehicle is performing transfer. This problem may be solved by making the buffer controller store in a non-volatile memory the information that the overhead travelling vehicle is performing transfer. However, this problem may be more reliably solved by detecting the hoist of the overhead travelling vehicle, a carrier raised or lowered, or the like by the optical sensors 20 shown in FIG. 1. Therefore, if the hoist or the like is detected, the entrance of the local vehicle to the detected stop position is prohibited (process P6). By the way, entrance into other stop positions are not prohibited. With this arrangement, before the recovery of the overhead travelling vehicle, buffer controller, the local vehicle, and the slidable buffer are recovered.

The local vehicle is configured and programmed to make a request for entrance for each of the stop positions. The buffer controller is configured and programmed not to permit transfer by the overhead travelling vehicle regarding positions already permitted to enter to the local vehicle (process P7). Note that regarding transfer between slidable buffers not under the travelling rails 8,8 shown in FIG. 1, no interference will occur with the local vehicle. Therefore, the interfere avoidance process is not necessary (process P8).

Figure 13:
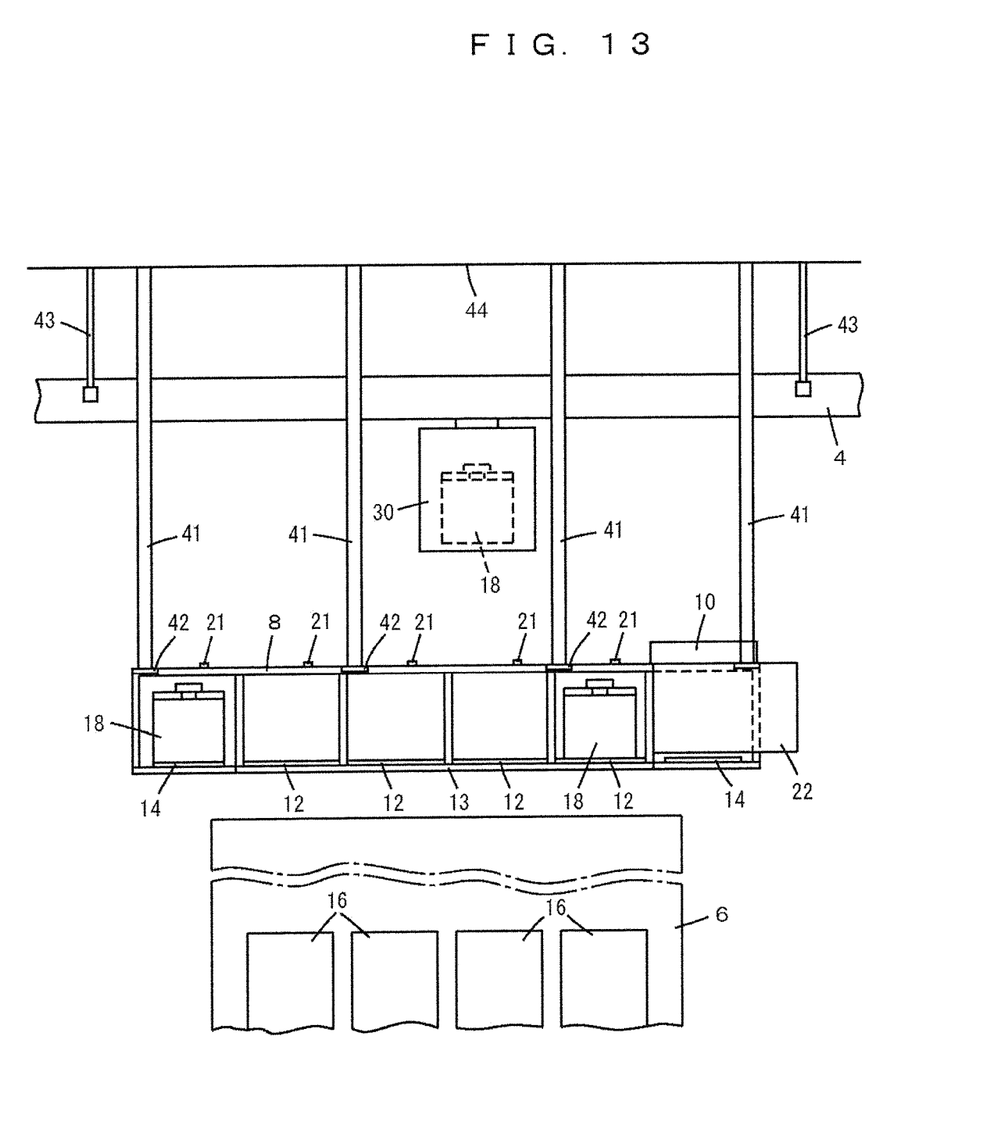
FIG. 13 is a fragmentary side view of a modification in which a temporary storage apparatus for carriers is supported from a ceiling.

As shown in FIG. 13, the temporary storage apparatus 2 may be supported from a ceiling 44 of the cleanroom by pillars 41 and connection portions 42, and the trestles 24 may be omitted. Reference numeral 43 denotes a pillar of the travelling rails 4 for the overhead travelling vehicle 30. In FIG. 13, the terminal 100 to 102 are not shown.

LIST OF REFERENCE NUMERALS 2, 40, 60 temporary storage apparatus for storing carriers (temporary storage apparatus)
4: travelling rail for overhead travelling vehicles
6: equipment
7: passage
8: travelling rail for local vehicles
10: local vehicle
12: slidable buffer
13: frame
14: fixed buffer
16: load port
18: carrier
20: optical sensor
21: reflection plate
22: buffer controller (controller)
24: trestle
25, 26: front face
30: overhead travelling vehicle (OHT)
32: travelling section
33: lateral transfer mechanism
34: raising and lowering drive
35: elevation platform
36: belt
38: anti-fall hood
44: ceiling
41, 43: pillar
42: connection portion
70: base
71: rail
72: pedestal
73: wheel
74: positioning pin
75: carrier sensor
76: seating sensor
77: ID reader
78: cylinder
79: piston
80: linear guide
81: rail
82: toothed belt
83, 84: sensor
85: cable guide
86: wheel
87: raising and lowering drive
88: elevation platform
90: material control system (MCS)
92: OHT controller
100 to 102: terminal

What is claimed is:

1. A temporary storage apparatus that temporarily stores carriers comprising:
a local vehicle comprising a hoist that raises and lowers a carrier and is configured to travel;
a travelling rail for the local vehicle provided 1) below a travelling rail for overhead travelling vehicles each comprising a hoist that raises and lowers a carrier and 2) over a load port;
a plurality of buffers provided along the travelling rail for the local vehicle, wherein carriers may be placed on the buffers by both the overhead travelling vehicles and the local vehicle;
a controller configured and programmed to control the local vehicle; and
a sensor provided at a height that avoids physical interference with the local vehicle and configured to detect an element of each of the hoists of the overhead travelling vehicles or a carrier being raised or lowered by each of the hoists of the overhead travelling vehicles;
wherein the controller is configured and programmed to prevent interference between the overhead travelling vehicles and the local vehicle by communication with the overhead travelling vehicles, and
the controller is configured and programmed to restrict the local vehicle from travelling in response to the sensor when the sensor detects an element of each of the hoists of the overhead travelling vehicles or a carrier of the overhead travelling vehicles.

2. The temporary storage apparatus according to claim 1, wherein each of the hoists of the overhead travelling vehicles is configured to raise and lower an elevation platform that holds the carrier by suspenders, and
the sensor is located at a position suitable for detecting the suspenders.

3. The temporary storage apparatus according to claim 1, wherein the travelling rail for the local vehicle is divided into a plurality of areas arranged along a travelling direction of the local vehicle, the sensor is provided in each area of the travelling rail for the local vehicle, and the controller is configured and programmed to prohibit the local vehicle from entering into a selected area when the sensor detects an element of the hoist or the carrier.

4. The temporary storage apparatus according to claim 1, wherein the plurality of buffers include a slidable buffer slidable between a position under the travelling rail for the local vehicle and a position laterally separated from the travelling rail for the local vehicle.

5. A temporary storage method that temporarily stores carriers comprising:

a local vehicle comprising a hoist that raises and lowers the carrier and is configured to travel;

a travelling rail for the local vehicle, provided at a position 1) below a travelling rail for overhead travelling vehicles each comprising a hoist that raises and lowers a carrier and 2) over a load port;

a plurality of buffers provided along the travelling rail for the local vehicle, wherein carriers can be placed on the buffers by both the overhead travelling vehicles and the local vehicle;

a controller configured and programmed to control the local vehicle; and a sensor provided at a height that avoids physical interference with the local vehicle and configured to detect an element of each of the hoists of the overhead travelling vehicles or a carrier being raised or lowered by each of the hoists of the overhead travelling vehicles, the temporary storage method comprising:

a step by the controller to communicate with the overhead travelling vehicles and to prevent interference between the overhead travelling vehicles and the local vehicle; and a step by the controller to restrict the local vehicle from travelling in response to the sensor upon detection by the sensor of an element of each of the hoists of the overhead travelling vehicles or a carrier of the overhead travelling vehicles.

\* \* \* \* \*